(12) United States Patent
Jung et al.

(10) Patent No.: US 6,998,442 B2
(45) Date of Patent: Feb. 14, 2006

(54) ORGANIC ANTI-REFLECTIVE COATING POLYMERS, ANTI-REFLECTIVE COATING COMPOSITION COMPRISING THE SAME AND PREPARATION METHODS THEREOF

(75) Inventors: Min-Ho Jung, Gyunggi-Do (KR); Jae-Chang Jung, Gyunggi-Do (KR); Geun-Su Lee, Gyunggi-Do (KR); Ki-Soo Shin, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 2 days.

(21) Appl. No.: 10/702,977

(22) Filed: Nov. 6, 2003

(65) Prior Publication Data

US 2004/0091623 A1 May 13, 2004

Related U.S. Application Data

(62) Division of application No. 10/037,552, filed on Jan. 4, 2002.

(30) Foreign Application Priority Data

Mar. 7, 2001 (KR) ............................... 2001-11724

(51) Int. Cl.
*C08L 33/14* (2006.01)
(52) U.S. Cl. ...................... 525/223; 525/222; 525/227; 525/231; 525/241; 427/372.2; 427/385.5
(58) Field of Classification Search ............. 525/222, 525/223, 227, 231, 241; 427/372.2, 385.5
See application file for complete search history.

(56) References Cited

U.S. PATENT DOCUMENTS

| | | | |
|---|---|---|---|
| 4,424,270 A | 1/1984 | Erdmann et al. | |
| 4,822,718 A | 4/1989 | Latham et al. | |
| 5,324,788 A | 6/1994 | Kuo | |
| 5,378,776 A | 1/1995 | Matsumura et al. | |
| 5,525,457 A | 6/1996 | Nemoto et al. | |
| 5,674,648 A | 10/1997 | Brewer et al. | |
| 6,210,856 B1 * | 4/2001 | Lin et al. | 430/270.1 |
| 6,365,321 B1 * | 4/2002 | Chen et al. | 430/270.1 |
| 6,368,521 B1 | 4/2002 | Sasaki et al. | |
| 6,458,907 B1 | 10/2002 | Angelopoulos et al. | |
| 2003/0077538 A1 | 4/2003 | Kitson et al. | |

FOREIGN PATENT DOCUMENTS

WO   WO 00/01752   1/2000

* cited by examiner

Primary Examiner—Helen L. Pezzuto
(74) Attorney, Agent, or Firm—Marshall, Gerstein & Borun LLP

(57) ABSTRACT

An organic anti-reflective polymer which prevents back reflection of lower film layers and eliminates standing wave that is occurred by a thickness change of photoresist and light, in a process for fabricating ultrafine patterns that use photoresist for lithography by using 193 nm ArF and its preparation method. More particularly, the organic anti-reflective polymer of the present invention is useful for fabricating ultrafine patterns of 64M, 256M, 1G, and 4G DRAM semiconductor devices. A composition containing such organic anti-reflective polymer, an anti-reflective coating layer made therefrom and a preparation method thereof.

18 Claims, No Drawings

ORGANIC ANTI-REFLECTIVE COATING POLYMERS, ANTI-REFLECTIVE COATING COMPOSITION COMPRISING THE SAME AND PREPARATION METHODS THEREOF

This is a divisional of U.S. application Ser. No. 10/037,552, filed Jan. 4, 2002.

BACKGROUND

1. Technical Field

An organic anti-reflective polymer which prevents back reflection of lower film layers and eliminates standing wave that occurs as a result of thickness changes of photoresist and light, in a process for fabricating ultrafine patterns that use photoresist for lithography by using 193 nm ArF and its preparation method are disclosed. More particularly, the organic anti-reflective polymer is disclosed that is useful for fabricating ultrafine patterns of 64M, 256M, 1G, and 4G DRAM semiconductor devices. A composition containing such organic anti-reflective polymer, an anti-reflective coating layer made therefrom and a preparation method thereof are also disclosed.

2. Description of the Background Art

In a fabrication process of ultrafine patterns for preparing semiconductor devices, standing waves and reflective notching inevitably occur due to the optical properties of lower film layer on the wafer and due to the thickness change of photosensitive film. In addition, there is another problem of the CD (critical dimension) alteration caused by diffracted and reflected light from the lower film layers. Thus, it has been suggested to introduce anti-reflective coating that enables preventing back reflection at a lower film layer by introducing organic material showing high absorbance at a wavelength range of the light employed as a light source.

Anti-reflective coating is classified into inorganic and organic anti-reflective coating depending upon the material used, or into absorptive and interfering anti-reflective coating based on the operation mechanism. For microlithography using I-line (365 nm wavelength) radiation, inorganic anti-reflective coating is predominantly used, while TiN and amorphous carbon as absorptive system and SiON as interfering system are employed.

In a fabrication process of ultrafine patterns using KrF laser, SION has been mainly used as an inorganic anti-reflective film. However, in the case of an inorganic anti-reflective film, no material has been known which enables the control of the interference at 193 nm, the wavelength of light source. Thus, there has been great deal of efforts to employ an organic compound as an anti-reflective coating.

To be a good organic anti-reflective coating, the following conditions must be satisfied:

(1) Peeling of the photoresist layer due to the dissolution in a solvent must not take place when conducting a lithographic process. In order to achieve this goal, a molded coating must be designed to form a cross-linked structure without producing any chemical as a by-product.

(2) Chemicals such as acid or amine must not migrate into or out from the anti-reflective coating. This is because when acid migrates from anti-reflective coating, undercutting occurs at a lower part of the pattern while footing may occur when a base such as amine migrates.

(3) The etching speed of the anti-reflective coating should be faster than that of the upper photosensitive film so as to facilitate etching process by using photosensitive film as a mask.

(4) Therefore, the anti-reflective coating must be as thin as possible to an extent to sufficiently play a role as an anti-reflective coating.

The existing organic anti-reflective material is mainly divided into two types, specifically, (1) polymers containing chromophore, cross-linking agent (single molecule) cross-linking the polymers and an additive (thermally variable oxidant) and (2) polymers which can cross link by themselves and contain chromophore and an additive (thermally variable oxidant). But these two types of anti-reflective material have a problem in that the control of k value is almost impossible because the content of the chromophore is defined according to the ratio as originally designed at the time of polymerization. Thus, if it is desired to change the k value, it must be synthesized again.

SUMMARY OF THE DISCLOSURE

A novel organic polymer for anti-reflective coating and its preparation method are disclosed.

An anti-reflective coating composition comprising the aforementioned polymer and a preparation method thereof are also disclosed.

Semiconductor devices on which a pattern is formed from such an anti-reflective coating by submicrolithography are also disclosed.

DETAILED DESCRIPTION OF THE PRESENTLY PREFERRED EMBODIMENTS

The following compounds having Formulas 1 and 2, respectively are provided which can be used in an anti-reflective coating.

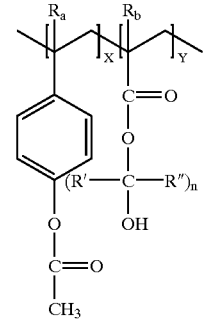

Formula I

In the above Formulas 1:

$R_a$, $R_b$ are each independently hydrogen or methyl;

R', R" are each independently —H, —OH, —OCOCH$_3$, —COOH, —CH$_2$OH, or substituted or unsubstituted, or straight or branched alkyl or alkoxy alkyl having 1 to 6 carbon atoms;

n represents an integer selected from 1, 2, 3, 4 and 5;

x, y each represents mole fraction from 0.01 to 0.99.

Formula 2

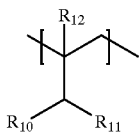

Further, in the above Formulas 2: $R_{10}$ and $R_{11}$ are each independently straight or branched substituted $C_{1-10}$ alkoxy alkyl; and $R_{12}$ is hydrogen or methyl.

The compound of Formula 2 is prepared by polymerizing (meth)acrolein to obtain poly(meth)acrolein followed by reacting the obtained polymeric product with branched or straight substituted alkyl alcohol having 1 to 10 carbon atoms.

In detail, (meth)acrolein is first dissolved in an organic solvent and added thereto a polymerization initiator to carry out polymerization under vacuum at 60 to 70° C. for 4 to 6 hours. Then, the obtained polymeric product is reacted with branched or straight substituted alkyl alcohol having 1 to 10 carbon atoms in the presence of trifluoromethylsulfonic acid as a catalyst at a room temperature for 20 to 30 hours.

In the above process, suitable organic solvent is selected from the group consisting of tetrahydrofuran (THF), cyclohexanone, dimethylformamide, dimethylsulfoxide, dioxane, methylethylketone, benzene, toluene, xylene and mixtures thereof. As a polymerization initiator, it can be mentioned 2,2-azobisisobutyronitrile (AIBN), benzoylperoxide, acetylperoxide, laurylperoxide, t-butylperacetate, t-butylhydroperoxide or di-t-butylperoxide. A preferred example of said alkyl alcohol having 1 to 10 carbon atoms is ethanol or methanol.

A preferred compound of Formula 2 is selected from the group consisting of the compounds of the following Formulas 3 to 6.

Formula 3

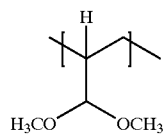

Formula 4

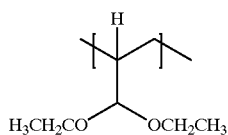

Formula 5

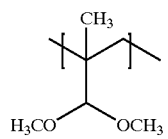

Formula 6

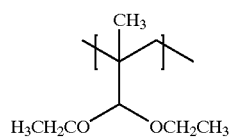

The above compounds of Formulas 3 to 6 are readily cured in the presence of acid and other polymers having alcohol group.

The polymer of Formula 1 is prepared by reacting acetoxystyrene monomer, hydroxyalkylacrylate monomer in an organic solvent and then polymerizing the obtained compound with a polymerization initiator. Any conventional organic solvent can be used in this process but a preferred solvent is selected from the group consisting of tetrahydrofuran, toluene, benzene, methylethylketone, dioxane and mixtures thereof. As a polymerization initiator, any conventional radical polymerization initiator can be used but it is preferred to use a compound selected from the group consisting of 2,2'-azobisisobutyronitrile, acetylperoxide, laurylperoxide, and t-butylperoxide. The above polymerization reaction is preferably carried out at a temperature ranging from about 50 to 90° C. and the mole ratio of each monomer is in the range of 0.01~0.99:0.01~0.99.

An anti-reflective coating composition comprises a polymer of Formula 1 and a polymer of Formula 2.

A preparation method of an organic anti-reflective coating comprises the steps of dissolving a polymer of Formula 1 and a compound of Formula 2 in an organic solvent, filtering the obtained solution, coating the filtrate on a lower layer and hard-baking the coated layer. Further, any conventional organic solvent can be used in this process but a preferred solvent is selected from the group consisting of ethyl 3-ethoxypropionate, methyl 3-methoxypropionate, cyclohexanone, and propyleneglycolmethylether acetate. It is preferred that the aforementioned solvent is used in an amount ranging from about 200 to about 5,000 wt. % based on the total weight of the anti-reflective coating resin used. The preferred temperature range for hard-baking ranges from about 100 to about 300° C.

A semiconductor device prepared from any of the aforementioned anti-reflective coating compositions of the present invention.

Two monomer(acetoxystyrene monomer, hydroxyalkylacrylate monomer) having a large sized chromophore was first synthesized to enable for a polymer made therefrom to achieve a high absorbance at the wavelength of 193 nm. Further, in order to allow improved properties to a produced organic anti-reflective coating, such as good molding property, air-tightness, and dissolution resistance, an epoxy group was introduced to raise a cross linking reaction during a hard-baking step following a coating step. The obtained polymer is referred to as a primary polymer (the compound of Formula 1). In addition, a secondary polymer (the compound of Formula 2), a compound capable of forming a cross linkage upon the reaction with an alcohol group in resin was also synthesized to form a cross-linked product with the primary polymer by a thermal reaction In particular, the cross-linking agents used are in the form of a polymer are designed to maximize the efficiency of the cross-linking reaction. Especially, it is possible to freely adjust the k value of the anti-reflective film by controlling the proportion of the primary polymer, laurylperoxide, and t-butylperoxide. The above polymerization reaction is preferably carried out at a temperature ranging from about 50 to 90° C. and the mole ratio of each monomer is in the range of 0.01~0.99:0.01~0.99.

An anti-reflective coating composition comprises a polymer of Formula 1 and a polymer of Formula 2.

A preparation method of an organic anti-reflective coating comprises the steps of dissolving a polymer of Formula 1 and a compound of Formula 2 in an organic solvent, filtering the obtained solution, coating the filtrate on a lower layer and hard-baking the coated layer. Further, any conventional organic solvent can be used in this process but a preferred solvent is selected from the group consisting of ethyl 3-ethoxypropionate, methyl 3-methoxypropionate, cyclohexanone, and propyleneglycolmethylether acetate. It is preferred that the aforementioned solvent is used in an amount ranging from about 200 to about 5,000 wt. % based on the total weight of the anti-reflective coating resin used. The preferred temperature range for hard-baking ranges from about 100 to about 300° C.

A semiconductor device prepared from any of the aforementioned anti-reflective coating compositions of the present invention.

Two monomer(acetoxystyrene monomer, hydroxyalkylacrylate monomer) having a large sized chromophore was first synthesized to enable for a polymer made therefrom to achieve a high absorbance at the wavelength of 193 mn. Further, in order to allow improved properties to a produced organic anti-reflective coating, such as good molding property, air-tightness, and dissolution resistance, an epoxy group was introduced to raise a cross linking reaction during a hard-baking step following a coating step. The obtained polymer is referred to as a primary polymer (the compound of Formula 1). In addition, a secondary polymer (the compound of Formula 2), a compound capable of forming a cross linkage upon the reaction with an alcohol group in resin was also synthesized to form a cross-linked product with the primary polymer by a thermal reaction In particular, the cross-linking agents used are in the form of a polymer are designed to maximize the efficiency of the cross-linking reaction. Especially, it is possible to freely adjust the k value of the anti-reflective film by controlling the proportion of the primary polymer, Further, the anti-reflective coating resin has a good solubility in all of the hydrocarbon solvents while has a dissolution resistance in any of the solvents during a hard-baking step. In addition, no undercutting or footing is experienced in the fabrication process of patterns. Especially, because the anti-reflective coating resin is made from acrylate polymer which enables higher etching speed relative to that of the photosensitive film during etching process, the etching selectivity is improved.

The following examples are set forth to illustrate more clearly the principles and practice of the disclosure to a person skilled in the art. As such, they are not intended to limit the disclosure, but are illustrative of certain preferred embodiments.

EXAMPLES

Example 1

Composition of poly[acetoxystyrene-(2-hydroxyethylacrylate)]copolymer

A 500 ml round bottom flask was charged with 0.1 mole of acetoxystyrene/0.1 mole of 2-hydroxyethylacrylate while stirring and 300 g of separately prepared tetrahydrofuran was added to a complete mixture. Thereafter, 0.1~3.0 g of 2,2'-azobisisobutyronitrile was added to allow a polymerization reaction at 60 to 75° C. under a nitrogen atmosphere for 5 to 20 hours. After the completion of the reaction, the obtained solution was precipitated with ethyl ether or n-hexane solvent and then filtered and dried to obtain poly[acetoxystyrene-(2-hydroxyethylacrylate)] resin of the following Formula 7 (yield: 82%).

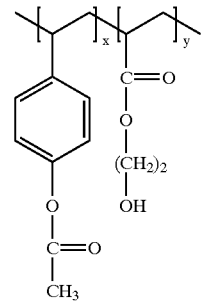

Formula 7

Example 2

Composition of poly[acetoxystyrene-(3-hydroxypropylacrylate)] copolymer

A 500 ml round bottom flask was charged with 0.1 mole of acetoxystyrene/0.1 mole of 3-hydroxypropylacrylate while stirring and 300 g of separately prepared tetrahydrofuran was added to a complete mixture. Thereafter, 0.1~3.0 g of 2,2'-azobisisobutyronitrile was added to allow a polymerization reaction at 60 to 75° C. under a nitrogen atmosphere for 5 to 20 hours. After the completion of the reaction, the obtained solution was precipitated with ethyl ether or n-hexane solvent and then filtered and dried to obtain poly[acetoxystyrene-(3-hydroxypropylacrylate)] resin of the following Formula 8 (yield: 80%).

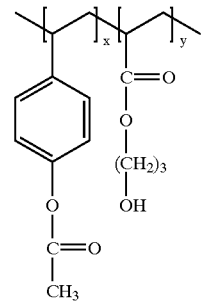

Formula 8

Example 3

Composition of poly[acetoxystyrene-(4-hydroxybutylacrylate)]copolymer

A 500 ml round bottom flask was charged with 0.1 mole of acetoxystyrene/0.1 mole of 4-hydroxybutylacrylate while stirring and 300 g of separately prepared tetrahydrofuran was added to a complete mixture. Thereafter, 0.1~3.0 g of 2,2'-azobisisobutyronitrile was added to allow a polymerization reaction at 60 to 75° C. under a nitrogen atmosphere for 5 to 20 hours. After the completion of the reaction, the obtained solution was precipitated with ethyl ether or n-hexane solvent and then filtered and dried to obtain poly[acetoxystyrene-(4-hydroxybutylacrylate)] resin of the following Formula 9 (yield: 79%).

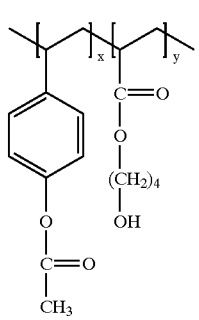

Formula 9

Example 4

Composition of poly[acetoxystyrene-2-hydroxyethylmethacrylate)] copolymer

A 500 ml round bottom flask was charged with 0.1 mole of acetoxystyrene/0.1 mole of 2-hydroxyethylmethacrylate while stirring and 300 g of separately prepared tetrahydrofuran was added to a complete mixture. Thereafter, 0.1~3.0 g of 2,2'-azobisisobutyronitrile was added to allow a polymerization reaction at 60 to 75° C. under a nitrogen atmosphere for 5 to 20 hours. After the completion of the reaction, the obtained solution was precipitated with ethyl ether or n-hexane solvent and then filtered and dried to obtain poly[acetoxystyrene-(2-hydroxyethyllmethacrylate)] resin of the following Formula 10 (yield: 83%).

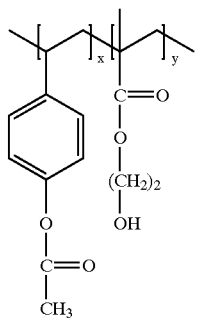

Formula 10

Example 5

Composition of poly[acetoxystyrene-(3-hydroxypropylmethacrylate)] copolymer A 500 ml round bottom flask was charged with 0.1 mole of acetoxystyrene/0.1 mole of 3-hydroxypropylmethacrylate while stirring and 300 g of separately prepared tetrahydrofuran was added to a complete mixture. Thereafter, 0.1~3.0 g of 2,2'-azobisisobutyronitrile was added to allow a polymerization reaction at 60 to 75° C. under a nitrogen atmosphere for 5 to 20 hours. After the completion of the reaction, the obtained solution was precipitated with ethyl ether or n-hexane solvent and then filtered and dried to obtain poly[acetoxystyrene-(3-hydroxypropylmethacrylate)] resin of the following Formula 11 (yield: 84%).

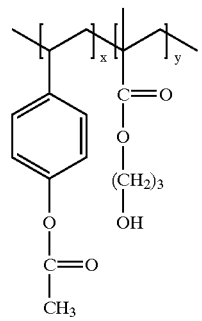

Formula 11

Example 6

Composition of poly[acetoxystyrene-(4-hydroxybutylmethacrylate)] copolymer

A 500 ml round bottom flask was charged with 0.1 mole of acetoxystyrene/0.1 mole of 4-hydroxybutylmethacrylate while stirring and 300 g of separately prepared tetrahydrofuran was added to a complete mixture. Thereafter, 0.1~3.0 g of 2,2'-azobisisobutyronitrile was added to allow a polymerization reaction at 60 to 75° C. under a nitrogen atmosphere for 5 to 20 hours. After the completion of the reaction, the obtained solution was precipitated with ethyl ether or n-hexane solvent and then filtered and dried to obtain poly[acetoxystyrene-(4-hydroxybutylmethacrylate)] resin of the following Formula 12 (yield: 78%).

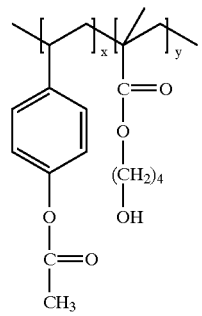

Formula 12

Example 7

Preparation of an Anti-reflective Coating Solution

A polymer of Formula 1 as prepared in one of Examples 1 to 6 and a polymer of Formula 2 were dissolved in propyleneglycolmethylether acetate(PGMEA). The obtained solution was filtered, coated on a wafer, and hard-baked at 100~300° C. for 10~1,000 seconds. Then, a photosensitive film was applied thereon and followed by a routine ultrafine pattern fabrication process.

The cross-linking agent used is in the form of a polymer is designed to maximize the cross-linking efficiency. Further, it is possible to freely modify the k value of an organic anti-reflective coating by controlling the proportion of a primary polymer. Thus, the present invention overcomes the prior art problem wherein the control of a k value was not possible.

Moreover, the anti-reflective coating resin includes two monomer having large sized chromophores, one of the chromophores has an effect of protecting undercutting due to unbalance of acidity after making a film owing to a weak basic, that enables a polymer made therefrom to achieve a high absorbance at the wavelength of 193 nm.

Further, the anti-reflective coating resin dissolves well in all hydrocarbon solvent, while does not dissolve in any of the solvents during a hard-baking step and it does not experience undercutting and footing in a fabrication process of patterns. Particularly, because the anti-reflective coating resin is composed of acrylate polymer, its etching speed is higher than that of a photosensitive film and thus, the etching selectivity can be improved.

The present invention has been described in an illustrative manner, and it is to be understood the terminology used is intended to be in the nature of description rather than of limitation. It must be understood that many modifications and variations of the present invention are possible in light of the above teachings. Therefore, it is to be understood that within the scope of the appended claims, the invention may be practiced otherwise than as specifically described.

What is claimed is:

1. An anti-reflective coating composition compound having the structure of the following Formula I and a compound of the following Formula 2:

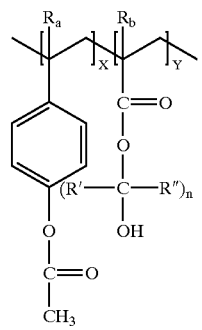

Formula I wherein:
$R_a$, $R_b$ are each independently hydrogen or methyl;
R' and R" are each independently selected from the group consisting of —H, —OH, —OCOCH$_3$, —COOH, —CH$_2$OH, alkyl having 1 to 6 carbon atoms and alkoxy alkyl having 1 to 6 carbon atoms;
n is an integer ranging from 1 to 5; and
x and y each represent mole fractions ranging from 0.01 to 0.99;

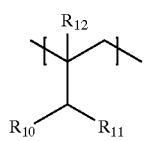

Formula 2 wherein,
$R_{10}$ and $R_{11}$ are each independently $C_{1-10}$ alkoxy alkyl, and $R_{12}$ is hydrogen or methyl.

2. The anti-reflective coating of claim 1 wherein the compound of Formula 1 is poly[acetoxystyrene-(2-hydroxyethylacrylate)].

3. The anti-reflective coating of claim 1 wherein the compound of Formula 1 is poly[acetoxystyrene-(3-hydroxypropylacrylate)].

4. The anti-reflective coating of claim 1 wherein the compound of Formula 1 is poly[acetoxystyrene-(4-hydroxybutylacrylate)].

5. The anti-reflective coating of claim 1 wherein the compound of Formula 1 is poly[acetoxystyrene-(2-hydroxyethyllmethacrylate)].

6. The anti-reflective coating of claim 1 wherein the compound of Formula 1 is poly[acetoxystyrene-(3-hydroxypropylmethacrylate)].

7. The anti-reflective coating of claim 1 wherein the compound of Formula 1 is poly[acetoxystyrene-(4-hydroxybutylmethacrylate)].

8. A method for preparing an anti-reflective coating comprising:
dissolving a compound of Formula 1 as follows and a compound of Formula 2 in an organic solvent to obtain a solution;
filtering the solution to obtain a filtrate;
coating the filtrate onto a lower layer of the substrate resulting in a coated layer disposed on the lower layer; and
hard-baking the coated layer;

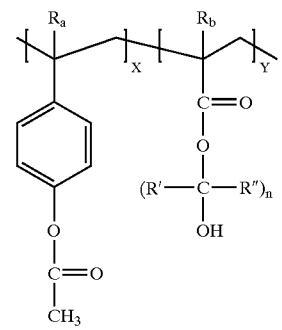

Formula I wherein:
$R_a$, $R_b$ are each independently hydrogen or methyl;
R' and R" are each independently selected from the group consisting of —H, —OH, —OCOCH$_3$, —COOH, —CH$_2$OH, alkyl having 1 to 6 carbon atoms and alkoxy alkyl having 1 to 6 carbon atoms;
n is an integer ranging from 1 to 5; and
x and y each represent mole fractions ranging from 0.01 to 0.99.

9. The method according to claim 8, wherein said organic solvent is selected from the group consisting of ethyl-3-ethoxypropionate, methyl 3-methoxypropionate, cyclohexanone, and propyleneglycolmethylether acetate.

10. The method according to claim 8, wherein said organic solvent is used in an amount ranging from about 200 to about 5,000 wt. % based on the total weight of the anti-reflective coating resin used.

11. The method according to claim 8, wherein the hard-baking step is carried out at a temperature ranging from about 100 to about 300° C.

12. A semiconductor device prepared from the anti-reflective coating composition of claim 1.

13. A semiconductor device prepared from the anti-reflective coating composition of claim 2.

14. A semiconductor device prepared from the anti-reflective coating composition of claim 3.

15. A semiconductor device prepared from the anti-reflective coating composition of claim 4.

16. A semiconductor device prepared from the anti-reflective coating composition of claim 5.

17. A semiconductor device prepared from the anti-reflective coating composition of claim 6.

18. A semiconductor device prepared from the anti-reflective coating composition of claim 7.

* * * * *